(12) United States Patent
Tsai et al.

(10) Patent No.: US 11,469,152 B2
(45) Date of Patent: Oct. 11, 2022

(54) SEMICONDUCTOR CHIP PACKAGE AND FABRICATION METHOD THEREOF

(71) Applicant: MEDIATEK INC., Hsin-Chu (TW)

(72) Inventors: Yi-Lin Tsai, Hsinchu (TW); Yi-Jou Lin, Hsinchu (TW); I-Hsuan Peng, Hsinchu (TW); Wen-Sung Hsu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 115 days.

(21) Appl. No.: 17/035,719

(22) Filed: Sep. 29, 2020

(65) Prior Publication Data

US 2021/0111090 A1    Apr. 15, 2021

Related U.S. Application Data

(60) Provisional application No. 62/914,575, filed on Oct. 14, 2019.

(51) Int. Cl.
| | | |
|---|---|---|
| *H01L 23/00* | (2006.01) | |
| *H01L 23/31* | (2006.01) | |
| *H01L 25/065* | (2006.01) | |
| *H01L 21/56* | (2006.01) | |

(52) U.S. Cl.
CPC ........ *H01L 23/3192* (2013.01); *H01L 21/563* (2013.01); *H01L 24/16* (2013.01); *H01L 25/0655* (2013.01); *H01L 2924/3511* (2013.01)

(58) Field of Classification Search
CPC ... H01L 23/3192; H01L 21/563; H01L 24/16; H01L 25/0655; H01L 24/32; H01L 24/81; H01L 23/3135
See application file for complete search history.

(56) References Cited

U.S. PATENT DOCUMENTS

| | | | | |
|---|---|---|---|---|
| 9,406,531 | B1 * | 8/2016 | Camacho | ................ H01L 24/43 |
| 2013/0168874 | A1 * | 7/2013 | Scanlan | ................ H01L 24/97 |
| | | | | 257/782 |
| 2019/0088550 | A1 * | 3/2019 | Ganitzer | ................ H01L 24/05 |

FOREIGN PATENT DOCUMENTS

| | | |
|---|---|---|
| CN | 101156237 A | 4/2008 |
| TW | M393805 U1 | 12/2010 |
| TW | 201110407 A1 | 3/2011 |

* cited by examiner

*Primary Examiner* — Nicholas J Tobergte
(74) *Attorney, Agent, or Firm* — Winston Hsu

(57) ABSTRACT

A semiconductor chip package includes a substrate having a top surface and a bottom surface, and a semiconductor device mounted on the top surface of the substrate. A gap is provided between the semiconductor device and the top surface of the substrate. A pre-cut laminate epoxy sheet is disposed on the top surface of the substrate and around a perimeter of the semiconductor device.

18 Claims, 8 Drawing Sheets

SEMICONDUCTOR CHIP PACKAGE AND FABRICATION METHOD THEREOF

CROSS REFERENCE TO RELATED APPLICATIONS

This application claims priority from U.S. provisional application No. 62/914,575 filed on Oct. 14, 2019, the disclosure of which is included in their entirety herein by reference.

BACKGROUND

This invention relates generally to semiconductor chip package assembly, and in particular to flip chip package assembly with improved warpage control.

In semiconductor device assembly, a semiconductor chip (or a "die") may be bonded directly to a packaging substrate (or a "substrate"). Such chips are formed with ball-shaped bumps of solder affixed to their input/output (I/O) bonding pads. During packaging, the chip is "flipped" onto its active circuit surface so that the solder balls form electrical connections directly between the chip and conductive pads on a packaging substrate. Semiconductor chips of this type are commonly called "flip chips."

In a conventional method for packaging a semiconductor flip chip, a chip and a packaging substrate are electrically connected and mechanically bonded in a solder joining operation. The chip is aligned with and placed onto a placement site on the packaging substrate such that the chip's solder balls are aligned with electrical pads or pre-solder on the substrate. The substrate is typically composed of an organic material or laminate. A reflow process is typically applied causing the solder balls to alloy and form electrical connections between the chip and the packaging substrate. The package is then cooled to harden the connection.

Semiconductor packages are typically subject to temperature cycling during normal operation. In order to improve the thermal performance and reliability of the packages, stiffeners are often used. A stiffener may be placed around the chip on the substrate where it is bonded with an adhesive. The stiffener is typically a flat piece of high modulus metal, having substantially the same dimensions as the package substrate with a window in its center to clear the die. Typically, the stiffener is composed of nickel-plated copper. The purpose of the stiffener is to constrain the substrate in order to prevent its warpage which may be caused by thermal cycling during operation of an electronic device in which the package is installed. However, even with the use of the stiffener, the package may still suffer from warpage to some degree.

During the cool down from the solder joining temperature, the package is highly stressed due to the different coefficients of thermal expansion (CTEs) of the substrate and chip materials. Shrinkage of the substrate is much more than that of the chip. The high stress experienced by these bonded materials during cooling may cause them to warp or crack and cause the package structure to bow. This problem is exacerbated in the case of a relatively large chip attached to a relatively small substrate. In this case, the bow of the package may exceed the co-planarity specification for packaged flip chips.

Accordingly, there is a need in this industry to provide an improved flip chip package and an improved packaging method that control package warpage within acceptable limits, thereby enhancing package reliability, particularly for large chip sizes.

SUMMARY

It is one object of the invention to provide an improved semiconductor chip package with improved package warpage control and reduced cost.

According to one aspect of the invention, a semiconductor chip package includes a substrate having a top surface and a bottom surface; a semiconductor device mounted on the top surface of the substrate, wherein a gap is provided between the semiconductor device and the top surface of the substrate; and a pre-cut laminate epoxy sheet disposed on the top surface of the substrate and around a perimeter of the semiconductor device.

According to some embodiments, the semiconductor device is a flip chip and is electrically and mechanically connected to the substrate through a plurality of connecting elements.

According to some embodiments, the plurality of connecting elements comprises controlled collapse chip connection (C4) bumps, micro-bumps, conductive pillars, or posts.

According to some embodiments, the semiconductor device is a multi-chip package.

According to some embodiments, the semiconductor device comprises four sidewalls, which are all covered with the pre-cut laminate epoxy sheet.

According to some embodiments, the pre-cut laminate epoxy sheet is a multi-layer laminate epoxy sheet comprising a first epoxy layer and a second epoxy layer.

According to some embodiments, the gap between the semiconductor device and the top surface of the substrate is filled with the first epoxy layer.

According to some embodiments, the first epoxy layer and the second epoxy layer both comprise epoxy resin and filler.

According to some embodiments, the first epoxy layer has a composition that is different from a composition of the second epoxy layer.

According to some embodiments, the first epoxy layer has an average filler size ranging between 5 and 100 micrometers and the second epoxy layer has an average filler size ranging between 0.1 and 10 micrometers.

According to some embodiments, the semiconductor chip package further comprises: a stiffener ring mounted on the top surface of the substrate around a perimeter of the pre-cut laminate epoxy sheet.

According to some embodiments, the semiconductor chip package further comprises: an underfill material filling into the gap between the semiconductor device and the top surface of the substrate.

According to another aspect of the invention, a method for fabricating a semiconductor chip package is disclosed. A substrate having a top surface and a bottom surface is provided. A semiconductor device is mounted on the top surface of the substrate, wherein a gap is provided between the semiconductor device and the top surface of the substrate. A pre-cut laminate epoxy sheet is formed on the top surface of the substrate and around a perimeter of the semiconductor device.

According to some embodiments, the pre-cut laminate epoxy sheet is a multi-layer laminate epoxy sheet comprising a first epoxy layer and a second epoxy layer.

According to some embodiments, the gap between the semiconductor device and the top surface of the substrate is filled with the first epoxy layer.

According to some embodiments, the first epoxy layer and the second epoxy layer both comprise epoxy resin and filler.

According to some embodiments, the first epoxy layer has a composition that is different from a composition of the second epoxy layer.

According to some embodiments, the first epoxy layer has an average filler size ranging between 5 and 100 micrometers and the second epoxy layer has an average filler size ranging between 0.1 and 10 micrometers.

According to some embodiments, after forming the pre-cut laminate epoxy sheet on the top surface of the substrate further comprises: mounting a stiffener ring on the top surface of the substrate around a perimeter of the pre-cut laminate epoxy sheet.

According to some embodiments, before forming the pre-cut laminate epoxy sheet on the top surface of the substrate, the method further comprises: filling the gap between the semiconductor device and the top surface of the substrate with an underfill material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings:

FIG. 9 to FIG. 11 illustrate an exemplary method for fabricating a semiconductor chip package in accordance with another embodiment of the invention, wherein

DETAILED DESCRIPTION

Figure 1:
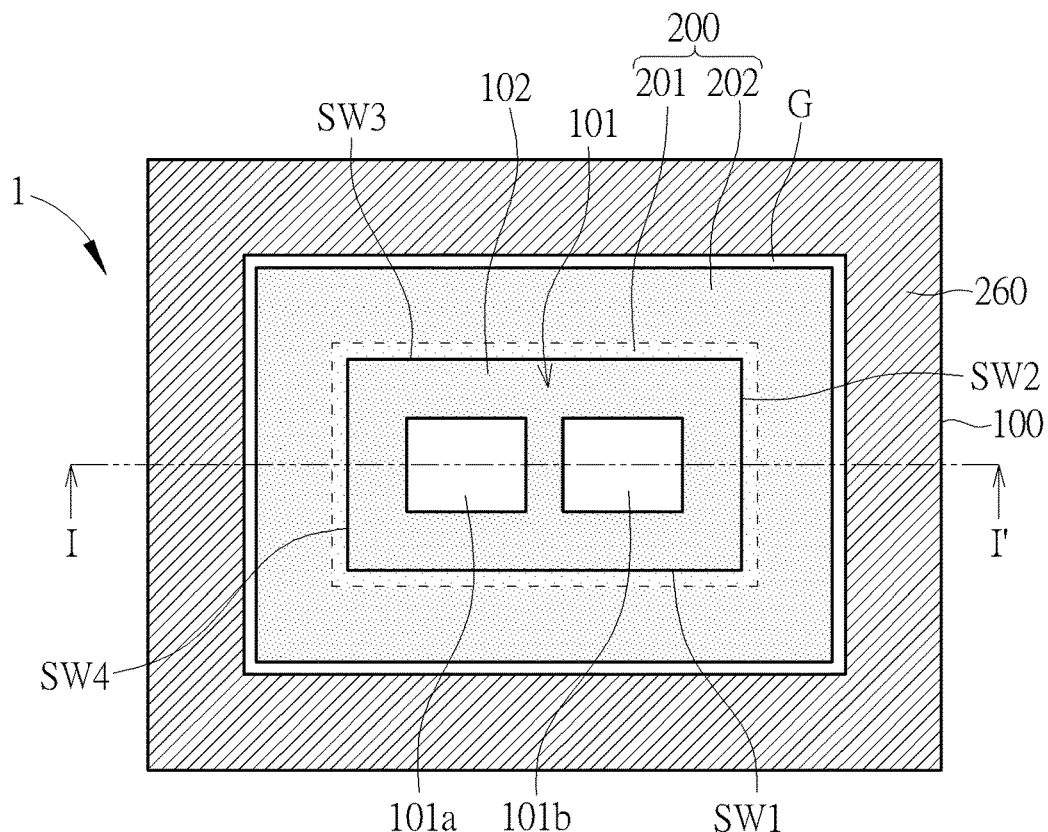
FIG. 1 is a schematic top view showing an exemplary semiconductor chip package in accordance with one embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Packaging of an integrated circuit (IC) chip can involve attaching the IC chip to a substrate (a packaging substrate) which, among other things, provides mechanical support and electrical connections between the chip and other electronic components of a device. Substrate types include, for example, cored substrates, including thin core, thick core (laminate BT (bismaleimide-triazine resin) or FR-4 type fibrous board material), and laminate core, as well as coreless substrates. Cored package substrates, for example, can be built up layer by layer around a central core, with layers of conductive material (usually copper) separated by layers of insulating dielectric, with interlayer connections being formed with through holes or microvias (vias).

Thermal design and material selection continues to be a concern for electronic packages, particularly for flip chip ball grid array packages (FCBGA). Larger chip/die sizes exhibit greater package warpage due to the difference in thermal expansion coefficients between silicon and laminate materials. As a result, large chip packages are more difficult to solder mount and may produce larger variations in the bond line thickness between the chip/die and external heat sinks. The package warpage may lead to the delamination in the low dielectric constant (low-k) interconnect layer(s) in the chip and may cause solder bump cracks.

The solder bump cracks may lead to device failure or degrade the long term operating reliability of the semiconductor device. Typically, the gap between a semiconductor chip and a substrate is undefilled to avoid these issues. The underfill material between the semiconductor chip and the substrate is used to increase the reliability of the package by reducing stresses on solder bumps. Typically, the underfill material is dispensed by using a so-called underfilling process that may include a capillary underfill dispensing operation.

The present disclosure pertains to a semiconductor chip package such as a flip chip ball grid array (FCBGA) package with a multi-layer laminate epoxy sheet that functions as a mold cap for package warpage control. In some embodiments, the multi-layer laminate epoxy sheet is disposed on a substrate to alleviate the package warpage. The size and shape of the laminate epoxy sheet can be customized according to the design requirements to fit the required area. It is advantageous to use the present invention because the laminate process is not complicated and is cost-effective, compared to conventional transfer molding or compression molding that requires particular equipment. In addition, a typical underfilling process may be skipped.

Figure 2:
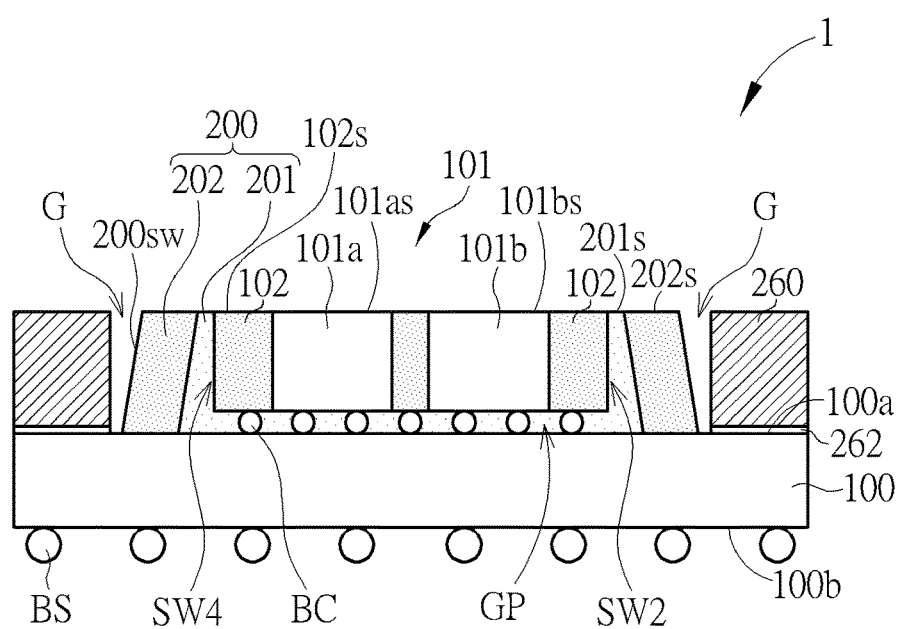
FIG. 2 is a schematic, cross-sectional view taken along line I-I' in FIG. 1.

Please refer to FIG. 1 and FIG. 2. FIG. 1 is a schematic top view showing an exemplary semiconductor chip package in accordance with one embodiment of the invention. FIG. 2 is a schematic, cross-sectional view taken along line I-I' in FIG. 1. As shown in FIG. 1 and FIG. 2, the semiconductor chip package 1 comprises a substrate 100 such as a packaging substrate or a printed wiring board. The substrate 100 has a top surface 100a and a bottom surface 100b. For the sake of simplicity, the traces and interconnection in the substrate 100 are not shown in the figures. It is understood that the substrate 100 may comprise traces and interconnection elements that provide electrical connections between a chip and an external electronic component such as a system board. On the bottom surface 100b, a plurality of ball grid array (BGA) balls BS may be provided.

According to an embodiment, a semiconductor device 101 such as a semiconductor chip or a chip package may be mounted on the top surface 100a in a flip-chip fashion. According to an embodiment, semiconductor device 101 may be a flip chip. According to an embodiment, for example, the semiconductor device 101 may be a fan-out multi-chip package or a system-in-package (SiP) comprising at least two semiconductor chips 101a and 101b in one package form. The at least two semiconductor chips 101a and 101b may comprise processor chips, memory chips, radio-frequency (RF) chips or the like, but not limited thereto. The at least two semiconductor chips 101a and 101b may be encapsulated by a molding compound 102. It is understood that the two semiconductor chips 101a and 101b are for illustration purposes only, and this invention should not be limited to the arrangement or configuration shown in the figures. Further, it is understood that a re-distribution layer (RDL) or a carrier (not shown) may be provided in the semiconductor device 101 to electrically connect the semiconductor chip 101a to the semiconductor chip 101b.

According to an embodiment, the semiconductor device 101 may be electrically and mechanically connected to the substrate 100 through a plurality of connecting elements BC such as controlled collapse chip connection (C4) bumps, micro-bumps, conductive pillars or posts, or the like. According to an embodiment, the semiconductor device 101 may have four sidewalls SW1~SW4, which are all covered with a pre-cut, multi-layer laminate epoxy sheet 200 comprising a first epoxy layer 201 and a second epoxy layer 202. The four sidewalls SW1~SW4 are in direct contact with the first epoxy layer 201. According to an embodiment, the multi-layer laminate epoxy sheet 200 may have an oblique sidewall 200sw. According to an embodiment, the oblique sidewall 200sw is not parallel with the four sidewalls SW1~SW4. According to an embodiment, both of the first epoxy layer 201 and a second epoxy layer 202 are in direct contact with the top surface 100a of the substrate 100.

According to an embodiment, a gap GP between the semiconductor device 101 and the top surface 100a of the substrate 100 is filled with the first epoxy layer 201. According to an embodiment, the first epoxy layer 201 and the second epoxy layer 202 both comprise epoxy resin and filler such as silica. According to an embodiment, the first epoxy layer 201 has a composition that is different from a composition of the second epoxy layer 202. According to an embodiment, for example, the first epoxy layer 201 has an average filler size that is smaller than that of the second epoxy layer 202. For example, the first epoxy layer 201 may have an average filler size ranging between 5 and 100 micrometers and the second epoxy layer 202 may have an average filler size ranging between 0.1 and 10 micrometers.

According to an embodiment, a top surface 101as of the semiconductor chip 101a and a top surface 101bs of the semiconductor chip 101b may be exposed. According to an embodiment, the top surface 101as of the semiconductor chip 101a and the top surface 101bs of the semiconductor chip 101b may be flush with a top surface 102s of the molding compound 102, a top surface 201s of the first epoxy layer 201, and a top surface 202s of the second epoxy layer 202.

According to an embodiment, optionally, a ring-shaped stiffener (or a stiffener ring) 260 may be secured onto the top surface 100a of the substrate 100 around the perimeter of the multi-layer laminate epoxy sheet 200. According to an embodiment, the ring-shaped stiffener 260 may be composed of nickel-plated copper, but is not limited thereto. In some embodiments, the ring-shaped stiffener 260 may be made of aluminum or any other suitable materials. According to an embodiment, the ring-shaped stiffener 260 may be adhered to the top surface 100a of the substrate 100 with an adhesive layer 262. According to an embodiment, a gap G may be formed between the ring-shaped stiffener 260 and the multi-layer laminate epoxy sheet 200. However, it is understood that the ring-shaped stiffener 260 may be in direct contact with the multi-layer laminate epoxy sheet 200 in some embodiments. According to some embodiment, the ring-shaped stiffener 260 may be omitted as long as the multi-layer laminate epoxy sheet 200 provides adequate mechanical strength for the package warpage control.

Figure 3:
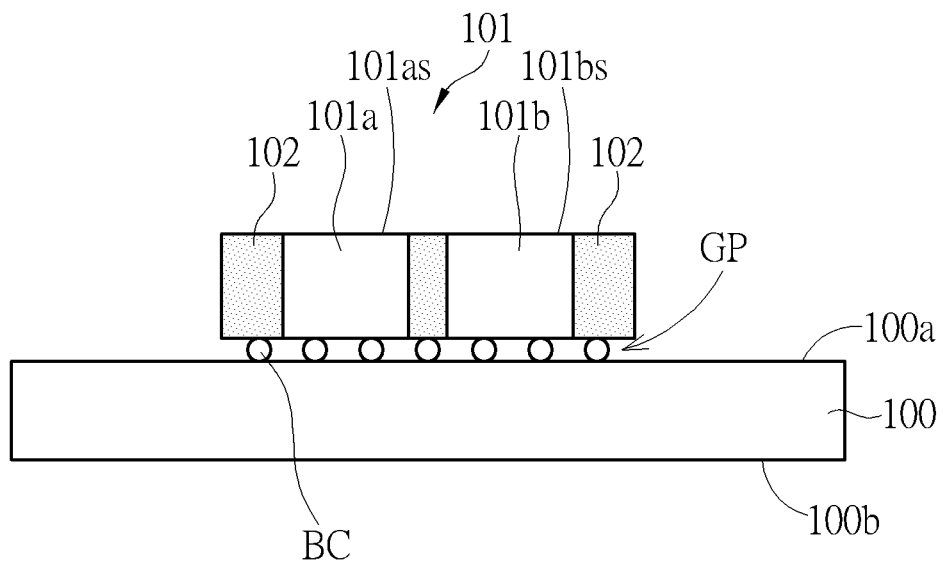
FIG. 3 to FIG. 6 illustrate an exemplary method for fabricating the semiconductor chip package depicted in FIG. 1 and FIG. 2.

Please refer to FIG. 3 to FIG. 6. FIG. 3 to FIG. 6 illustrate an exemplary method for fabricating the semiconductor chip package depicted in FIG. 1 and FIG. 2, wherein like regions, layers, or elements are designated by like numeral numbers or labels. As shown in FIG. 3, first, a substrate 100 such as a packaging substrate or a printed wiring board is provided. The substrate 100 has a top surface 100a and a bottom surface 100b. For the sake of simplicity, the traces and interconnection in the substrate 100 are not shown in the figures. It is understood that the substrate 100 may comprise traces and interconnection elements that provide electrical connections between a chip and an external electronic component such as a system board.

A semiconductor device 101 such as a semiconductor chip or a chip package may be mounted on the top surface 100a in a flip-chip fashion with a gap GP between the semiconductor device 101 and the top surface 100a of the substrate 100. According to an embodiment, semiconductor device 101 may be a flip chip. According to an embodiment, for example, the semiconductor device 101 comprising at least two semiconductor chips 101a and 101b in one package form. The at least two semiconductor chips 101a and 101b may comprise processor chips, memory chips, RF chips or the like, but not limited thereto. The at least two semiconductor chips 101a and 101b may be encapsulated by a molding compound 102. It is understood that the two semiconductor chips 101a and 101b are for illustration purposes only, and this invention should not be limited to the arrangement or configuration shown in the figures. The semiconductor device 101 may be electrically and mechanically connected to the substrate 100 through a plurality of connecting elements BC.

Figure 4:
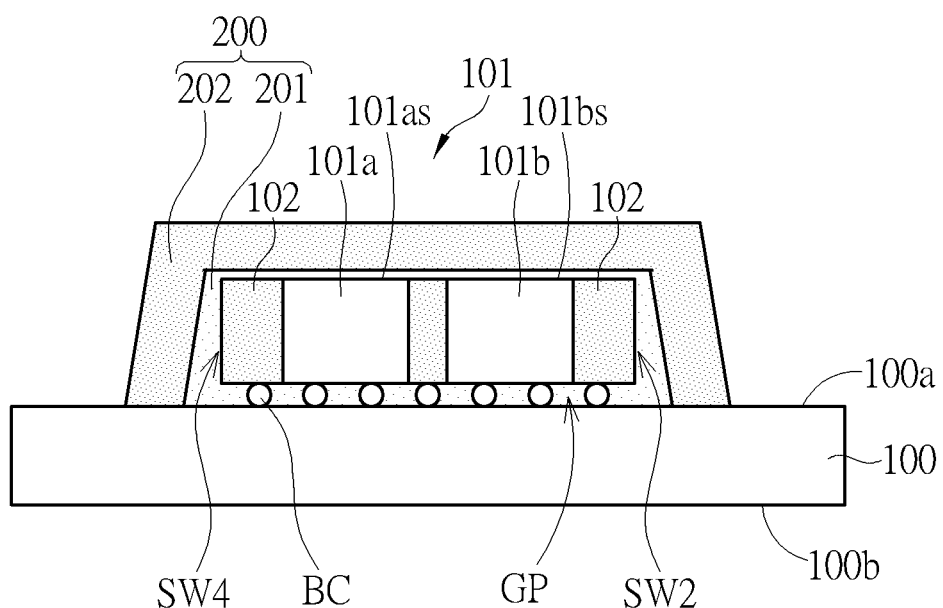

As shown in FIG. 4, the semiconductor device 101 is then covered with a multi-layer laminate epoxy sheet 200 comprising a first epoxy layer 201 and a second epoxy layer 202. The gap GP between the semiconductor device 101 and the top surface 100a of the substrate 100 is filled with the first epoxy layer 201. According to an embodiment, the first epoxy layer 201 and the second epoxy layer 202 comprise epoxy resin and filler such as silica. According to an embodiment, the first epoxy layer 201 has a composition that is different from a composition of the second epoxy layer 202. According to an embodiment, for example, the first epoxy layer 201 has an average filler size that is smaller than that of the second epoxy layer 202. For example, the first epoxy layer 201 may have an average filler size ranging between 5 and 100 micrometers and the second epoxy layer 202 may have an average filler size ranging between 0.1 and 10 micrometers.

According to an embodiment, the formation of the multi-layer laminate epoxy sheet 200 on the semiconductor device 101 may be carried out in a vacuum environment within a processing chamber (not shown). The substrate 100 having thereon the semiconductor device 101 may be heated in the processing chamber to a predetermined temperature, for example, 100~150 degrees Celsius, but not limited thereto. According to an embodiment, after the multi-layer laminate epoxy sheet 200 is laminated onto the semiconductor device 101 and the substrate 100, the pressure in the processing chamber may be increased to a predetermined level.

Figure 5:
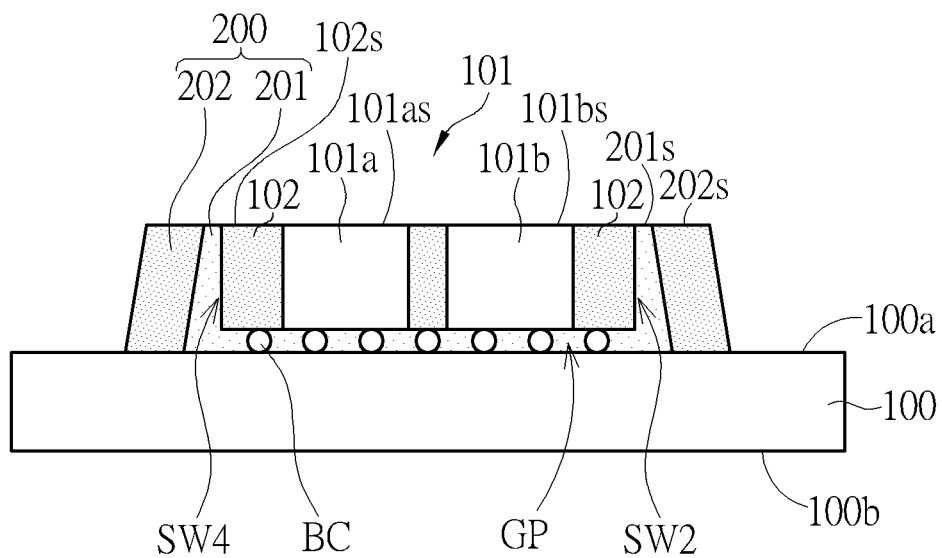

As shown in FIG. 5, optionally, a polishing process may be performed to remove a portion of the multi-layer laminate epoxy sheet 200 from the top surface 101as of the semiconductor chip 101a and the top surface 101bs of the semiconductor chip 101b. Therefore, the top surface 101as of the semiconductor chip 101a and the top surface 101bs of the semiconductor chip 101b may be exposed. According to an embodiment, the top surface 101as of the semiconductor chip 101a and the top surface 101bs of the semiconductor chip 101b may be flush with a top surface 102s of the molding compound 102, a top surface 201s of the first epoxy layer 201, and a top surface 202s of the second epoxy layer 202.

Figure 6:
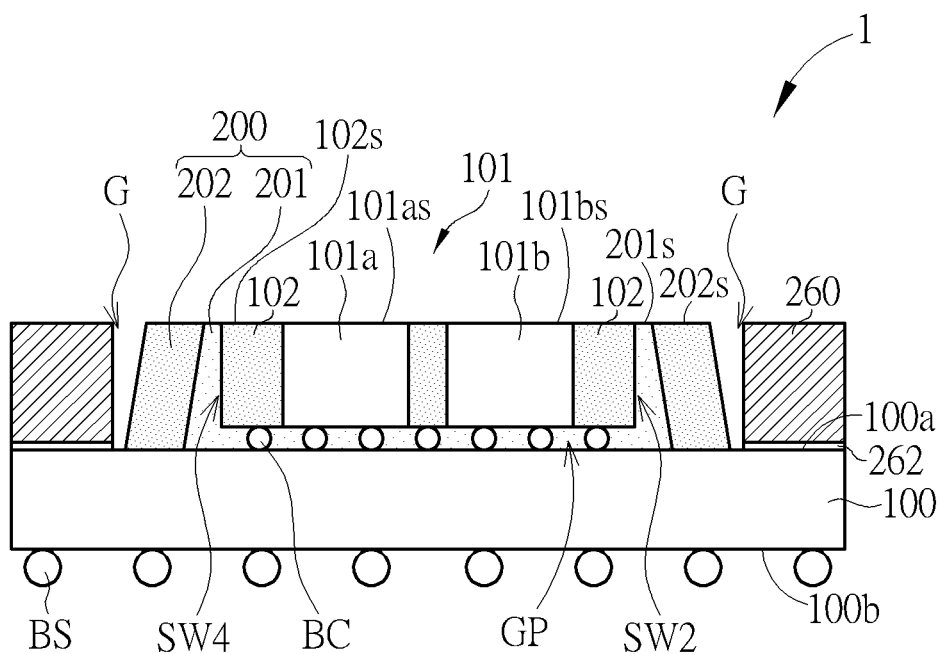

As shown in FIG. 6, after the polishing process is completed, a ring-shaped stiffener 260 may be secured onto the top surface 100a of the substrate 100 around the perimeter of the multi-layer laminate epoxy sheet 200. According to an embodiment, the ring-shaped stiffener 260 may be composed of nickel-plated copper, but is not limited thereto. In some embodiments, the ring-shaped stiffener 260 may be made of aluminum or any other suitable materials. According to an embodiment, the ring-shaped stiffener 260 may be adhered to the top surface 100a of the substrate 100 with an adhesive layer 262. Subsequently, on the bottom surface 100b of the substrate 100, a plurality of BGA balls BS may be provided.

Figure 7:
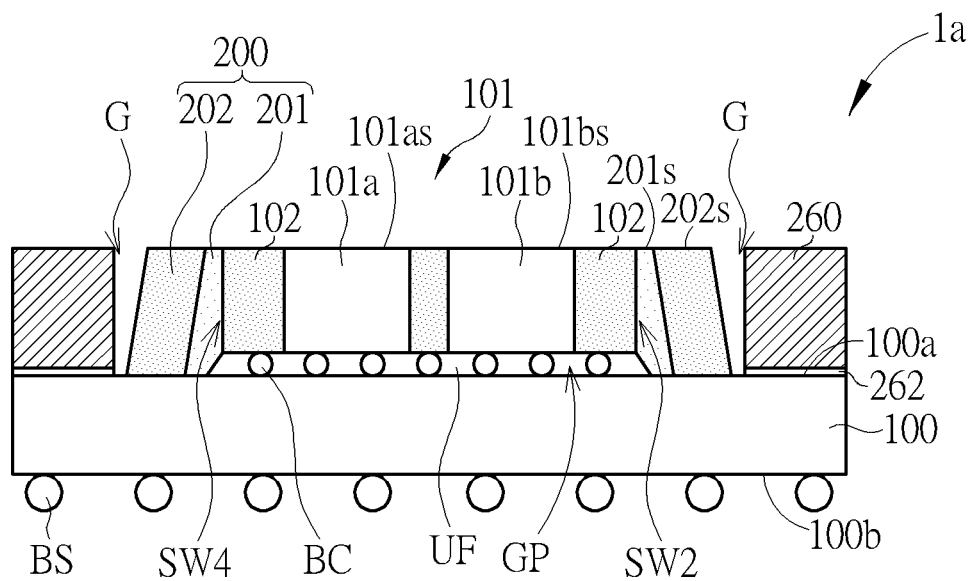
FIG. 7 is a schematic, cross-sectional view showing a semiconductor chip package in accordance with another embodiment of the invention.

FIG. 7 is a schematic, cross-sectional view showing a semiconductor chip package 1a in accordance with another embodiment of the invention. As shown in FIG. 7, the lamination of the multi-layer laminate epoxy sheet 200 may be performed after the gap GP is underfilled with an underfill material UF. Therefore, the first epoxy layer 201 of the semiconductor chip package 1a does not extend into the gap GP between the semiconductor device 101 and the top surface 100a of the substrate 100. According to an embodiment, the underfill material UF may have a composition that is different from a composition of the multi-layer laminate epoxy sheet 200. In some embodiments, the underfill material UF may have a composition that is the same as a composition of the multi-layer laminate epoxy sheet 200.

Figure 8:
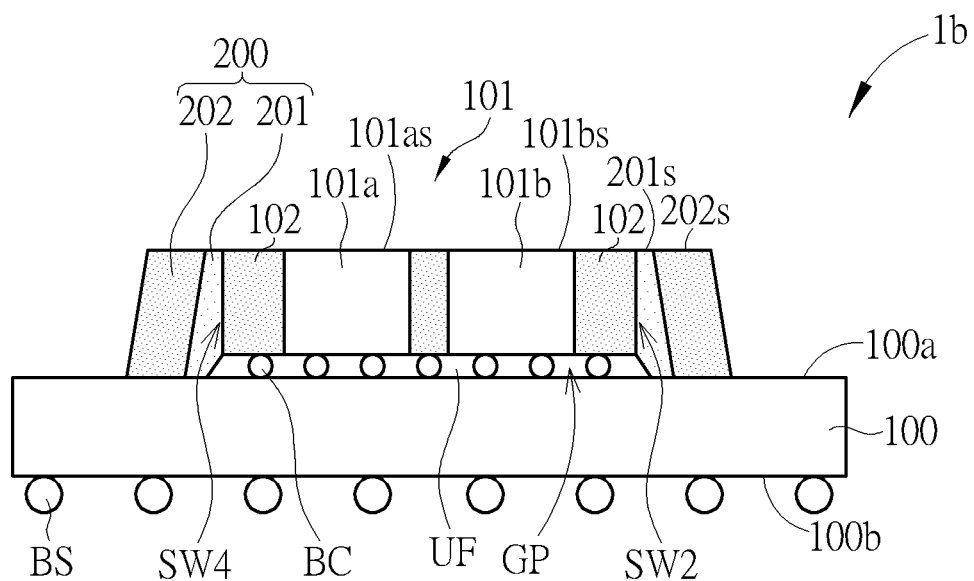
FIG. 8 is a schematic, cross-sectional view showing a semiconductor chip package in accordance with another embodiment of the invention.

FIG. 8 is a schematic, cross-sectional view showing a semiconductor chip package 1b in accordance with another embodiment of the invention. As shown in FIG. 8, the difference between the semiconductor chip package 1a in FIG. 7 and the semiconductor chip package 1b in FIG. 8 is that the semiconductor chip package 1b in FIG. 8 does not include a metal stiffener mounted on the substrate 100 around the multi-layer laminate epoxy sheet 200. Therefore, the cost can be further reduced. As previously mentioned, the ring-shaped stiffener may be omitted as long as the multi-layer laminate epoxy sheet 200 provides adequate mechanical strength for the package warpage control.

Figure 9:
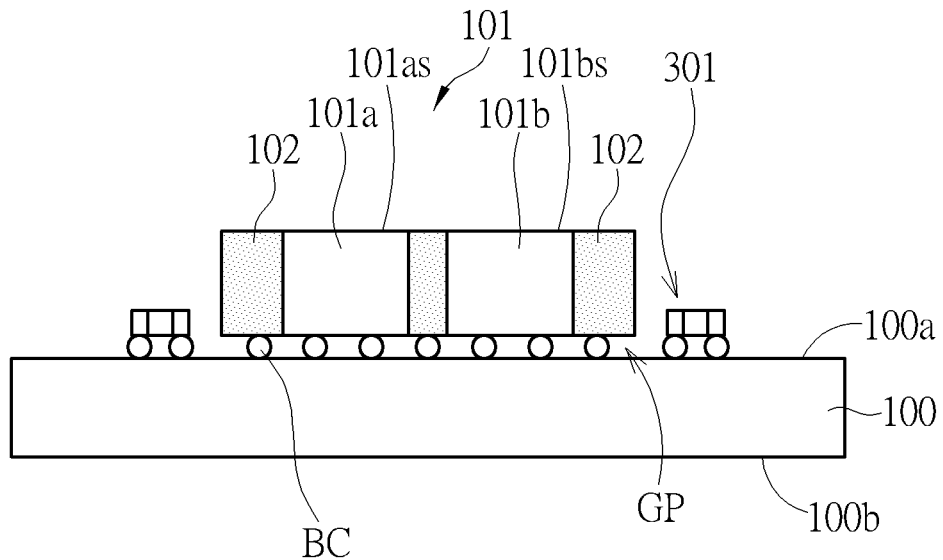
Figure 10:
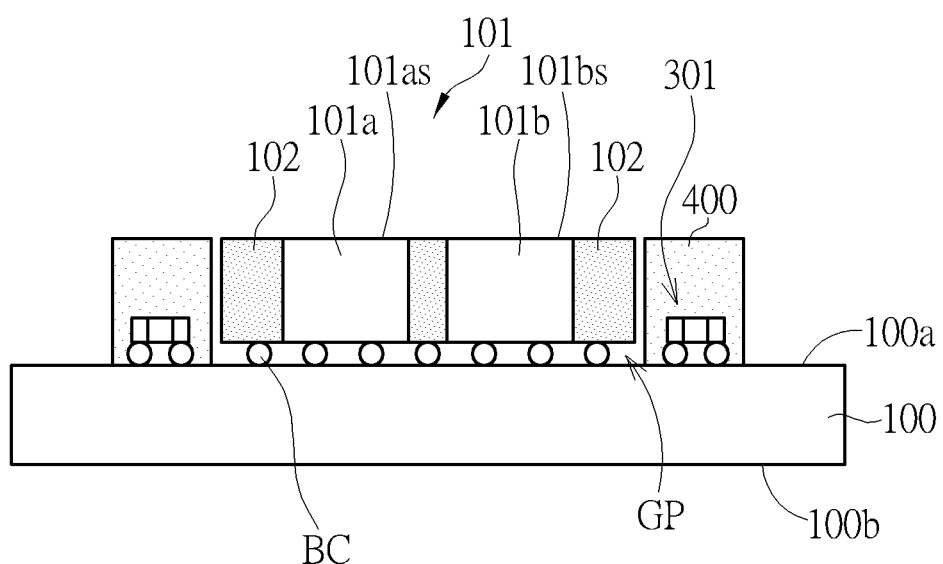
Figure 11:
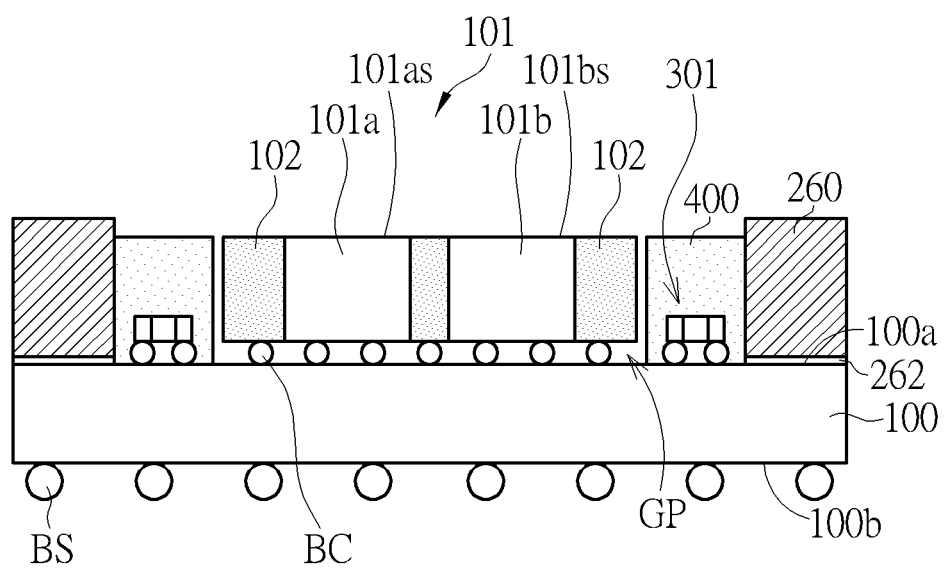

FIG. 9 to FIG. 11 illustrate an exemplary method for fabricating a semiconductor chip package 2 in accordance with another embodiment of the invention, wherein like regions, layers, or elements are designated by like numeral numbers or labels. As shown in FIG. 9, likewise, a substrate 100 such as a packaging substrate or a printed wiring board is provided. The substrate 100 has a top surface 100a and a bottom surface 100b. For the sake of simplicity, the traces and interconnection in the substrate 100 are not shown in the figures. It is understood that the substrate 100 may comprise traces and interconnection elements that provide electrical connections between a chip and an external electronic component such as a system board.

A semiconductor device 101 such as a semiconductor chip or a chip package may be mounted on the top surface 100a in a flip-chip fashion with a gap GP between the semiconductor device 101 and the top surface 100a of the substrate 100. According to an embodiment, for example, the semiconductor device 101 comprising at least two semiconductor chips 101a and 101b in one package form. The at least two semiconductor chips 101a and 101b may comprise processor chips, memory chips, RF chips or the like, but not limited thereto. The at least two semiconductor chips 101a and 101b may be encapsulated by a molding compound 102. It is understood that the two semiconductor chips 101a and 101b are for illustration purposes only, and this invention should not be limited to the arrangement or configuration shown in the figures. The semiconductor device 101 may be electrically coupled to the substrate 100 through a plurality of connecting elements BC. Optionally, a passive device 301 such as a decoupling capacitor, a resistor, or an inductor may be mounted on the top surface 100a of the substrate 100. The passive device 301 may be disposed in proximity to the semiconductor device 101.

As shown in FIG. 10, a pre-cut laminate epoxy sheet 400 is laminated on a peripheral region of the top surface 100a of the substrate 100 around the semiconductor device 101. According to an embodiment, the passive device 301 may be covered with the laminate epoxy sheet 400. According to an embodiment, the laminate epoxy sheet 400 may have multiple layers. According to an embodiment, the laminate epoxy sheet 400 may have one single layer. According to an embodiment, the gap GP between the semiconductor device 101 and the top surface 100a of the substrate 100 is not filled with the laminate epoxy layer 400.

Figure 10A:
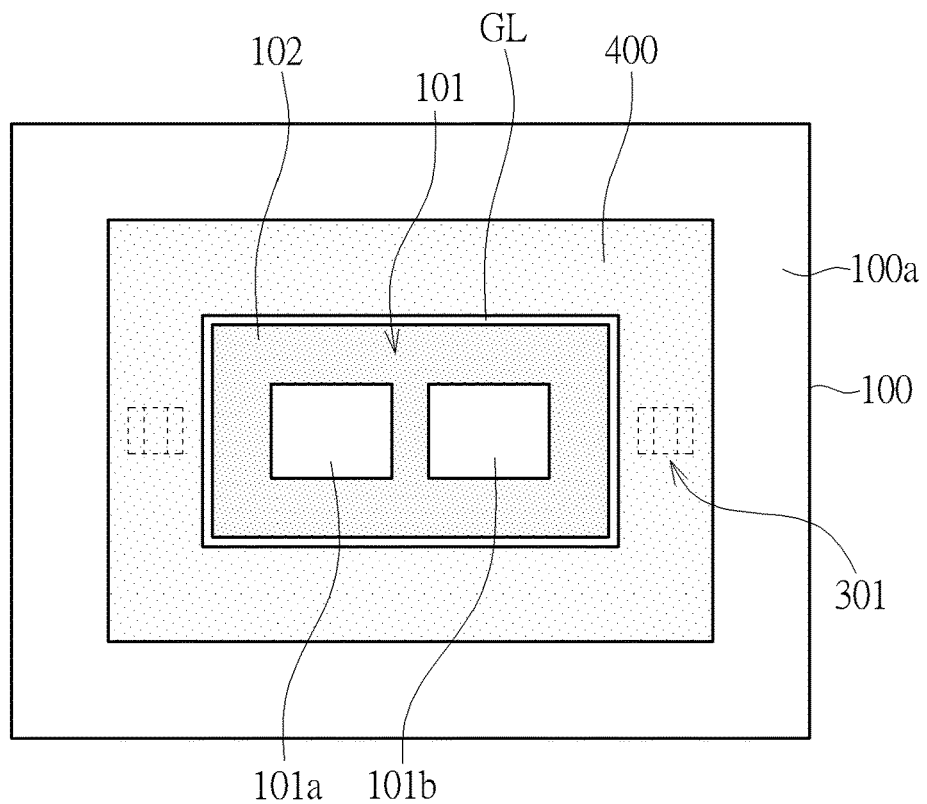
FIG. 10A and FIG. 10B are schematic top views showing exemplary layouts of the laminate epoxy sheet on the substrate.
Figure 10B:
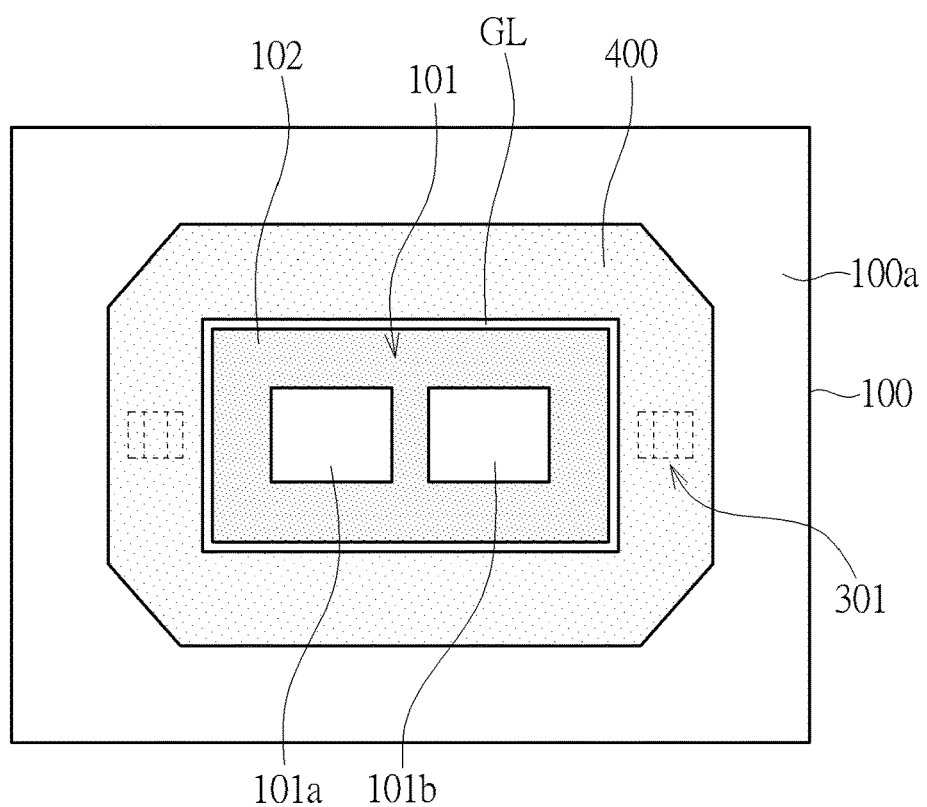

FIG. 10A and FIG. 10B are schematic top views showing exemplary layouts of the laminate epoxy sheet on the substrate in accordance with embodiments of the invention. As shown in FIG. 10A, for example, the laminate epoxy sheet 400 may have a rectangular outline with a window in its center, which is similar to a picture frame. According to an embodiment, a gap GL may be provided between the edges of the laminate epoxy sheet 400 and the edges of the semiconductor device 101. As shown in FIG. 10B, for example, the laminate epoxy sheet 400 may have an octagonal outline with a window in its center. It is to be understood that the shapes and sizes of the laminate epoxy sheet 400 in the figures are for illustration purposes only and may be optimized according to the design requirements.

As shown in FIG. 11, a ring-shaped stiffener 260 may be secured onto the top surface 100a of the substrate 100 around the perimeter of the laminate epoxy sheet 400. According to an embodiment, the ring-shaped stiffener 260 may be composed of nickel-plated copper, but is not limited thereto. In some embodiments, the ring-shaped stiffener 260 may be made of aluminum or any other suitable materials. According to an embodiment, the ring-shaped stiffener 260 may be adhered to the top surface 100a of the substrate 100 with an adhesive layer 262. According to an embodiment, the laminate epoxy sheet 400 may be in direct contact with the stiffener 260, but not limited thereto. In some embodiments, the laminate epoxy sheet 400 may be not in direct contact with the stiffener 260. Subsequently, on the bottom surface 100b of the substrate 100, a plurality of BGA balls BS may be provided.

Figure 12:
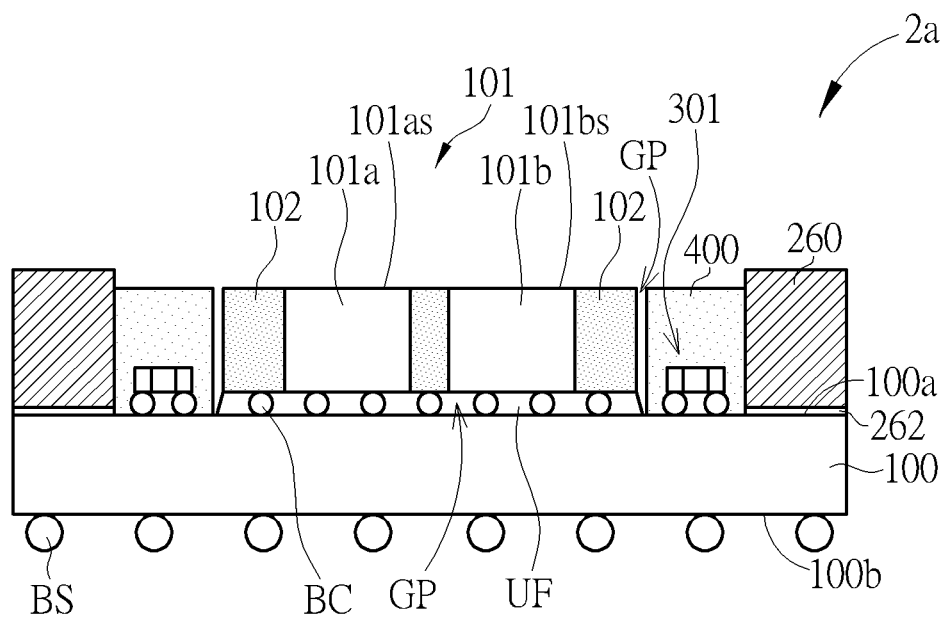
FIG. 12 is a schematic, cross-sectional view showing a semiconductor chip package in accordance with still another embodiment of the invention.

FIG. 12 is a schematic, cross-sectional view showing a semiconductor chip package 2a in accordance with still another embodiment of the invention. As shown in FIG. 12, the formation of the laminate epoxy sheet 400 may be performed after the gap GP is underfilled with an underfill material UF. According to an embodiment, the laminate epoxy sheet 400 may be in direct contact with the underfill material UF, but not limited thereto. In some embodiments, the laminate epoxy sheet 400 may be not in direct contact with the underfill material UF.

Figure 13:
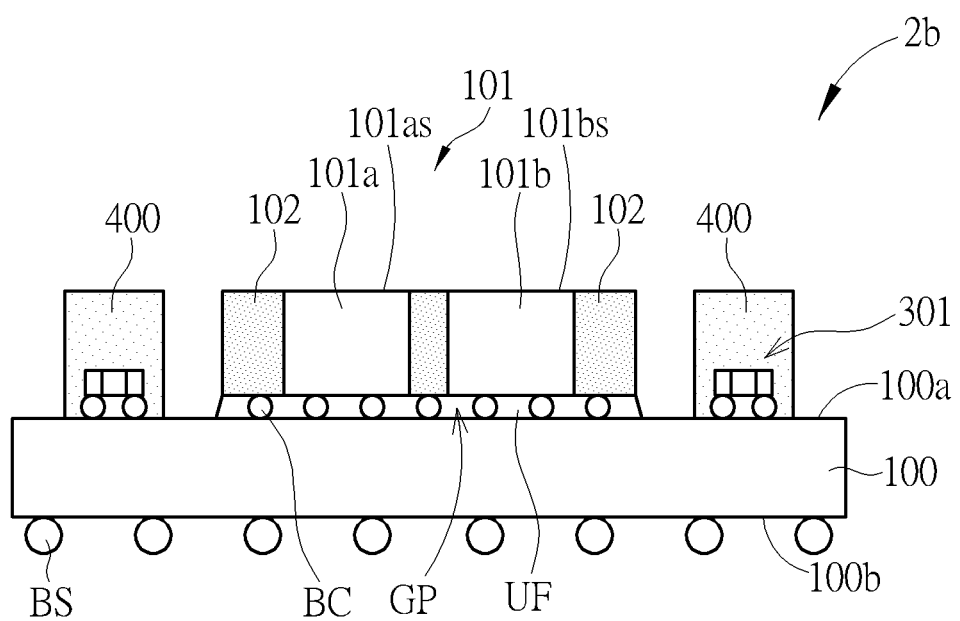
FIG. 13 is a schematic, cross-sectional view showing a semiconductor chip package in accordance with yet another embodiment of the invention.

FIG. 13 is a schematic, cross-sectional view showing a semiconductor chip package 1b in accordance with yet another embodiment of the invention. As shown in FIG. 13, the difference between the semiconductor chip package 2a in FIG. 12 and the semiconductor chip package 2b in FIG. 13 is that the semiconductor chip package 2b in FIG. 13 does not include a metal stiffener mounted on the substrate 100 around the laminate epoxy sheet 400. Therefore, the cost can be further reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip package, comprising:
a substrate having a top surface and a bottom surface;
a semiconductor device mounted on the top surface of the substrate, wherein a gap is provided between the semiconductor device and the top surface of the substrate, wherein the semiconductor device is a flip chip and is electrically and mechanically connected to the substrate through a plurality of connecting elements; and
a pre-cut laminate epoxy sheet disposed on the top surface of the substrate and around a perimeter of the semiconductor device.

2. The semiconductor chip package according to claim 1, wherein the plurality of connecting elements comprises controlled collapse chip connection (C4) bumps, microbumps, conductive pillars, or posts.

3. The semiconductor chip package according to claim 1, wherein the semiconductor device is a multi-chip package.

4. The semiconductor chip package according to claim 1, wherein the semiconductor device comprises four sidewalls, which are all covered with the pre-cut laminate epoxy sheet.

5. The semiconductor chip package according to claim 1, wherein the pre-cut laminate epoxy sheet is a multi-layer laminate epoxy sheet comprising a first epoxy layer and a second epoxy layer.

6. The semiconductor chip package according to claim 5, wherein the gap between the semiconductor device and the top surface of the substrate is filled with the first epoxy layer.

7. The semiconductor chip package according to claim 5, wherein the first epoxy layer and the second epoxy layer both comprise epoxy resin and filler.

8. The semiconductor chip package according to claim 5, wherein the first epoxy layer has a composition that is different from a composition of the second epoxy layer.

9. The semiconductor chip package according to claim 5, wherein the first epoxy layer has an average filler size ranging between 5 and 100 micrometers and the second epoxy layer has an average filler size ranging between 0.1 and 10 micrometers.

10. The semiconductor chip package according to claim 1 further comprising:
a stiffener ring mounted on the top surface of the substrate around a perimeter of the pre-cut laminate epoxy sheet.

11. The semiconductor chip package according to claim 1 further comprising:
an underfill material filled into the gap between the semiconductor device and the top surface of the substrate.

12. A method for fabricating a semiconductor chip package, comprising:
providing a substrate having a top surface and a bottom surface;
mounting a semiconductor device on the top surface of the substrate, wherein a gap is provided between the semiconductor device and the top surface of the substrate;
forming a pre-cut laminate epoxy sheet on the top surface of the substrate around a perimeter of the semiconductor device; and
mounting a stiffener ring on the top surface of the substrate around a perimeter of the pre-cut laminate epoxy sheet.

13. The method according to claim 12, wherein the pre-cut laminate epoxy sheet is a multi-layer laminate epoxy sheet comprising a first epoxy layer and a second epoxy layer.

14. The method according to claim 13, wherein the gap between the semiconductor device and the top surface of the substrate is filled with the first epoxy layer.

15. The method according to claim 13, wherein the first epoxy layer and the second epoxy layer both comprise epoxy resin and filler.

16. The method according to claim 13, wherein the first epoxy layer has a composition that is different from a composition of the second epoxy layer.

17. The method according to claim 13, wherein the first epoxy layer has an average filler size ranging between 5 and 100 micrometers and the second epoxy layer has an average filler size ranging between 0.1 and 10 micrometers.

18. The method according to claim 12, wherein before forming the pre-cut laminate epoxy sheet on the top surface of the substrate, the method further comprises:
filling the gap between the semiconductor device and the top surface of the substrate with an underfill material.

* * * * *